United States Patent
Zhang et al.

(10) Patent No.: US 6,313,698 B1
(45) Date of Patent: *Nov. 6, 2001

(54) METHOD AND APPARATUS FOR WIRELESS PHONE TRANSMIT POWER AMPLIFICATION WITH REDUCED POWER CONSUMPTION

(75) Inventors: Yang Zhang; Yongsheng Peng, both of San Diego, CA (US)

(73) Assignee: Qualcomm Incorporated, San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/404,890

(22) Filed: Sep. 24, 1999

(51) Int. Cl.[7] .............................. H03G 3/14; H03F 3/68
(52) U.S. Cl. ............................................. 330/51; 330/133
(58) Field of Search ........................... 330/51, 133, 134, 330/150, 151

(56) References Cited

U.S. PATENT DOCUMENTS 5,530,923 * 6/1996 Heinonen et al. ................. 330/51 X
5,661,434 * 8/1997 Brozovich et al. .................... 330/51
5,909,643 * 6/1999 Aihara .............................. 330/51 X

FOREIGN PATENT DOCUMENTS 977354  2/1999  (EP).
2282291  3/1995  (GB).

OTHER PUBLICATIONS

Moroney et al., "A High Performance Switched LNA IC for CDMA Handset Receiver Applications", IEEE RFIC Symposium Jan., 1998 pp. 43–46.*

* cited by examiner

Primary Examiner—Steven J. Mottola
(74) Attorney, Agent, or Firm—Philip R. Wadsworth; Charles D. Brown

(57) ABSTRACT

A method and apparatus for RF amplification of a transmit signal within a wireless phone. The amplifier chain is composed of three parts, a pre-driver, a bypassable driver amp, and a power amp. The configuration of the amplifier chain is adjusted in real time to optimize power consumption for a given output power requirement. At low output power levels the driver amp is bypassed and the power amp is provided a low bias current. At medium output power levels the driver amp is bypassed and the power amp is biased at a moderate current. When high output power is required the driver amp is utilized and the power amp is provided a high bias current. The driver amp is shut down when in the bypassed state. The result of implementing this amplifier configuration is an increase in the efficiency of the transmit amplifier. The increase in amplifier efficiency results in increased talk times for battery powered wireless phones.

13 Claims, 3 Drawing Sheets

METHOD AND APPARATUS FOR WIRELESS PHONE TRANSMIT POWER AMPLIFICATION WITH REDUCED POWER CONSUMPTION

BACKGROUND OF THE INVENTION

I. Field of the Invention

The present invention relates to RF amplifiers. More particularly, the present invention relates to a novel and improved method and apparatus for RF amplification of a wireless phone transmit signal.

II. Description of the Related Art

A mobile unit or wireless phone integrates numerous complex circuits. An RF transceiver is used to provide the wireless communication link with base stations. The RF transceiver is comprised of a receiver and a transmitter. The antenna, interfaced to the mobile unit, receives the RF transmission from the base station and outputs the signal to the receiver. The receiver amplifies, filters, and downconverts the received signal to baseband. The baseband signal is then routed to a baseband processing circuit. The baseband processing circuit demodulates the signal and conditions it for broadcast through a speaker to the user.

User input via keypad presses or voice input to a microphone is conditioned in the baseband processing circuit. The signal is modulated and routed to the transmitter. The transmitter takes baseband signals generated in the mobile unit and upconverts, filters, and amplifies the signal. The upconverted and amplified RF signal is transmitted to the base station through the same antenna as used for the receiver.

The design requirements of sustained high quality voice and data transmission must be balanced against the design requirements of battery operation, small size, low cost, and high reliability. The requirement that a mobile unit operate under battery power presents various issues that must be addressed. Batteries can only provide a limited amount of energy. Minimizing power consumption is the only way to extend battery life.

Increasing consumer demands to reduce the size and weight of a portable phone put further pressure on the hardware designer to reduce the size and weight available for a battery. Advances in battery technology allow for some reclamation of available energy storage lost due to size reduction. However, the overall trend is towards decreased phone power consumption as a means for extending phone talk and standby times while simultaneously reducing the form factor of the phone.

The transmit RF amplifier chain is one of the greatest sources of power consumption in a mobile phone. The design of the transmit RF amplifier chain in a Code Division Multiple Access (CDMA) mobile phone is further constrained by specifications imposed on output power range and output emissions. Specifications constraining mobile phone design include Telecommunications Industry Association (TIA)/Electronic Industries Association (EIA) IS-95-B MOBILE STATION-BASE STATION COMPATABILITY STANDARD FOR DUAL-MODE SPREAD SPECTRUM SYSTEMS as well as TIA/EIA IS-98-B, RECOMMENDED MINIMUM PERFORMANCE STANDARDS FOR DUAL-MODE SPREAD SPECTRUM CELLULAR MOBILE STATIONS. However, comparable specifications exist for mobile phones operating in other than the cellular frequency band as well as for mobile phones utilizing alternative modulation schemes such as Time Division Multiple Access (TDMA) or analog Frequency Modulation (FM). The specification covering the operation of a CDMA system in the Personal Communication Systems (PCS) band is the American National Standards Institute (ANSI) J-STD-008 PERSONAL STATION-BASE STATION COMPATIBILITY REQUIREMENTS FOR 1.8 TO 2.0 GHZ CODE DIVISION MULTIPLE ACCESS (CDMA) PERSONAL COMMUNICATIONS SYSTEMS. Similarly, the phone, or personal station, is specified in ANSI J-STD-018, RECOMMENDED MINIMUM PERFORMANCE REQUIREMENTS FOR 1.8 TO 2.0 GHZ CODE DIVISION MULTIPLE ACCESS (CDMA) PERSONAL STATIONS.

A successful amplifier design must satisfy all required specifications as well as minimize power consumption. One method of minimizing power consumption within an RF power amplifier is to utilize an efficient amplifier topology. Class A power amplifiers provide the best linearity but also are the most inefficient. Class AB power amplifiers provide increased efficiency over class A amplifiers at a cost of increased output distortion. The non-linear characteristics of the class AB power amplifier make it suitable only as the final high power amplifier in the transmit RF amplifier chain. Other amplifier topologies are not suitable for a CDMA mobile phone operating within the TIA/EIA IS-95-B specification because they are unable to meet the linearity requirements.

However, one single amplifier is incapable of providing the gain, output power, and linearity required in the transmit path. Therefore, several amplifiers must be cascaded in series to satisfy the transmit path requirements. What is required is a cascaded RF amplifier configuration that maintains the linearity necessary for CDMA communications while minimizing power consumption in order to maximize battery life.

SUMMARY OF THE INVENTION

The present invention is a novel and improved method and apparatus for RF amplification of a wireless phone transmit signal. The amplifier chain uses three separate amplifier stages: a pre-driver amp, a driver amp, and a high power amp. The amplifier chain is configured such that the driver stage can be bypassed. When the driver stage is bypassed the signal only passes through the pre-driver amp and the high power amp. The bias current on the high power amplifier is controlled to one of three values depending on the required output power.

Two data bits are used to control the switches bypassing the driver amp as well as the bias current setting on the high power amp. When a first output power is required from the amplifiers, the data bits are set so that the driver amp is bypassed and a first bias current is provided to the high power amplifier. A second output power is defined to be greater than a first output power. When second output power is required from the amplifier the data bits are such that the driver amp is bypassed and a second bias current is provided to the high power amplifier. The second bias current is greater than the first bias current. A third output power is defined to be greater than either the first or second output power levels. When a third output power is required from the amplifier the data bits are set such that the signal is routed through the driver amp and a third bias current is provided to the high power amplifier. The third bias current is greater than either the first or second bias currents. No bias current is provided to the driver amp when it is in the bypassed state.

Therefore, three relative power levels are defined, a first, a second and a third that correspond to relatively low, moderate, and high amplifier output power. Each of the three power levels utilizes a corresponding bias current for the high power amplifier. The first, second, and third bias currents correspond to relatively low, medium, and high bias currents for the high power amplifier.

An RF calibration table is used to control the output power from the amplifier and provides an indication of the output power to a signal processor. The signal processor then compares the output power with a calibrated threshold to set the data bits to control the amplifier settings as detailed above. The data bits are dynamically updated as the RF power fluctuates up and down in response to internal phone commands or over-the-air power control information. Hysteresis is incorporated into the threshold values in order to prevent frequent toggling of the amplifier settings when the power level is near a threshold. Therefore a window represents the threshold and the actual value at which the amplifier control is changed will depend on whether the RF power is increasing or decreasing.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

A wireless phone utilizes an RF transmitter to communicate from the phone to the base station. In wireless phones such as those operating in accordance with TIA/EIA IS-95-B the actual RF output power is tightly controlled to maximize the communication link quality while simultaneously minimizing interference. The phone adjusts the RF output power through open loop as well as closed loop control. The phone utilizes open loop mode when it has not established a communication link with a base station. As an example, when the phone is attempting to connect to a base station in order to set up a traffic call the phone utilizes open loop estimates of the output power to set the phone to the minimum level required to access the base station. Additionally, when the phone has established a communication link with the base station, as in the case of a traffic call, the phone uses open loop power control to compensate for signal fading and nulls caused by phone movement. The open loop process utilizes the received signal strength as a basis for estimating the loss from the phone to the base station. Since the received signal is on a different frequency than the transmitted signal there is not good path loss correlation between the two. Therefore, the open loop response time is slow to minimize instances of over compensation. The condition of a wireless phone travelling within a vehicle gives rise to many signal fades and nulls that occur too quickly to be satisfactorily handled using open loop power control.

The rapid changes in path loss are compensated using closed loop power control. In closed loop power control the phone receives a periodic message from the base station which instructs it to raise or lower the transmit power. The power step size is a predetermined constant therefore the base station only sends information instructing the phone to increase or decrease the output power. The phone must be capable of controlling the output power to the accuracy of the predetermined step size.

Figure 1:
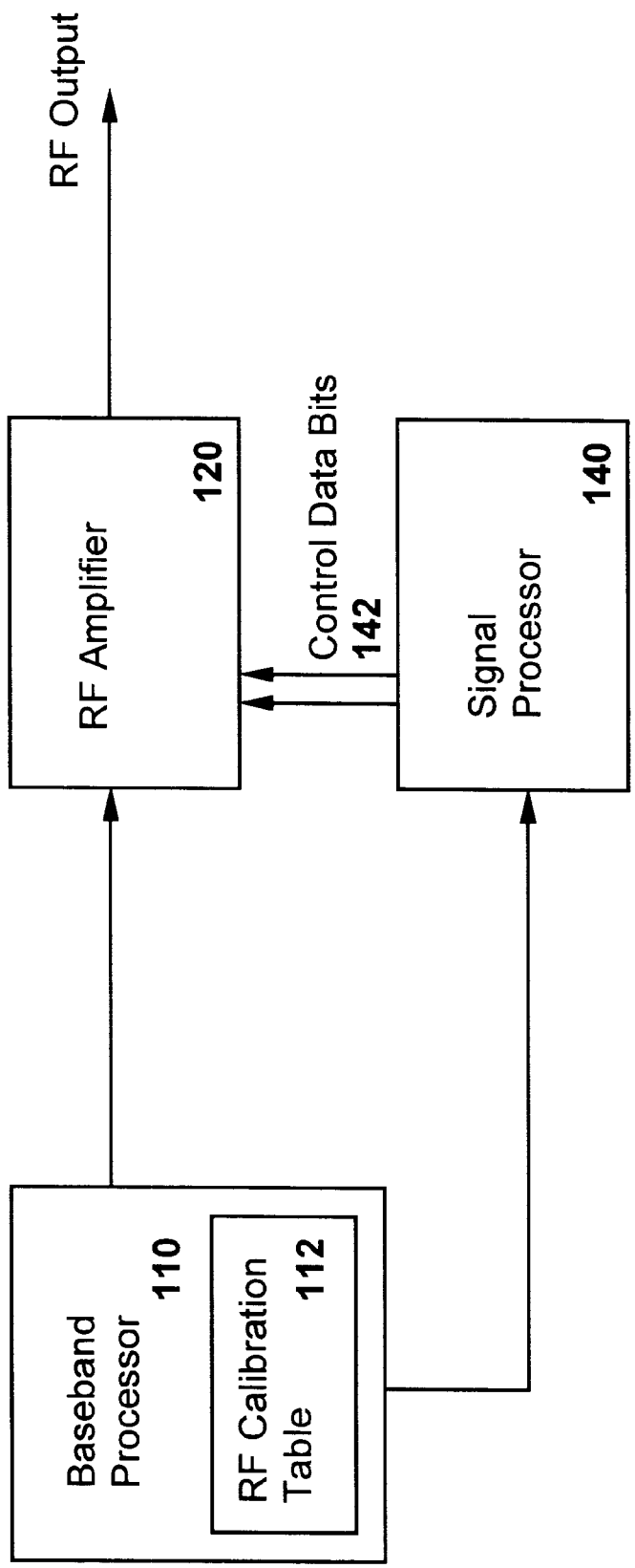
FIG. 1 is a block diagram of a wireless phone transmitter signal path.

A basic block diagram of a wireless phone transmit path is shown in FIG. 1. In a typical wireless phone the user provides input to the phone via some user interface (not shown) such as a keypad or microphone. The user interface converts the user input to an electrical signal that is sent to the baseband processor 110. If the signal is to be transmitted to a base station the baseband processor 110 modulates the signal onto a carrier and upconverts the frequency to the final transmitter frequency. The upconverted signal is then sent to the RF amplifier 120 where the signal level is increased. The output of the RF amplifier 120 may be filtered or sent to a protection circuit such as an isolator (not shown) before connection to an antenna (not shown) where the signal is broadcast to the base station.

An RF attenuator is used in the baseband processor 110 to adjust the signal power level at the input to the RF amplifier 120. In order to support open loop and closed loop power control the RF output is measured and calibrated over the entire range of the attenuator. The measurement results are stored in an RF calibration table 112 within the baseband processor 110. The RF calibration table 112 accounts for any gain switching performed in the RF amplifier 120. The baseband processor 110 controls gain switching in the RF amplifier 120. Gain switching is accomplished by designating an attenuator value in the baseband processor 110 at which gain in the RF amplifier 120 should be reduced. When the attenuator reaches this predetermined setting an instruction is sent to a signal processor 140 that operates two data control bits 142. The two data control bits 142 control gain switching in the RF amplifier. Two possible RF amplifier 120 gain switching implementations are shown in FIGS. 2A–2B.

An Automatic Gain Control (AGC) amplifier can be used as in the baseband processor 110 as an alternative to the RF attenuator. The AGC amplifier serves the same purpose as the RF attenuator, that is, adjusting the signal power level to the input of the RF amplifier 120. The AGC amplifier is able to provide a wide gain variation. The RF output is calibrated over the entire range of the AGC amplifier. The gain of the entire RF transmit chain can be achieved by characterizing the RF output over the entire range of the AGC amplifier while using a constant power input to the AGC amplifier. The measurements characterizing the gain are saved in the RF calibration table 112. When gain is switched in the RF amplifier 120 the sudden gain change is compensated using the RF calibration table 112 and the AGC amplifier. This ensures a linear change in transmit path gain as the RF amplifier 120 is controlled to switch gain stages in and out.

Figure 2A:
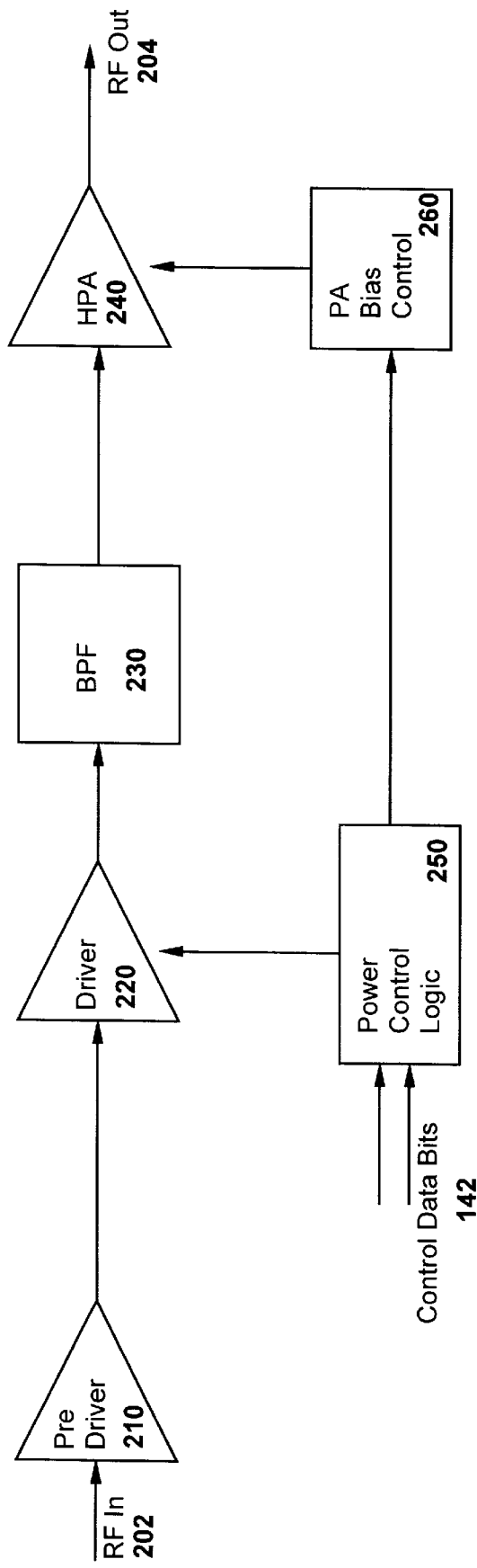
FIGS. 2a–b are block diagrams of RF amplifier implementations.
Figure 2B:
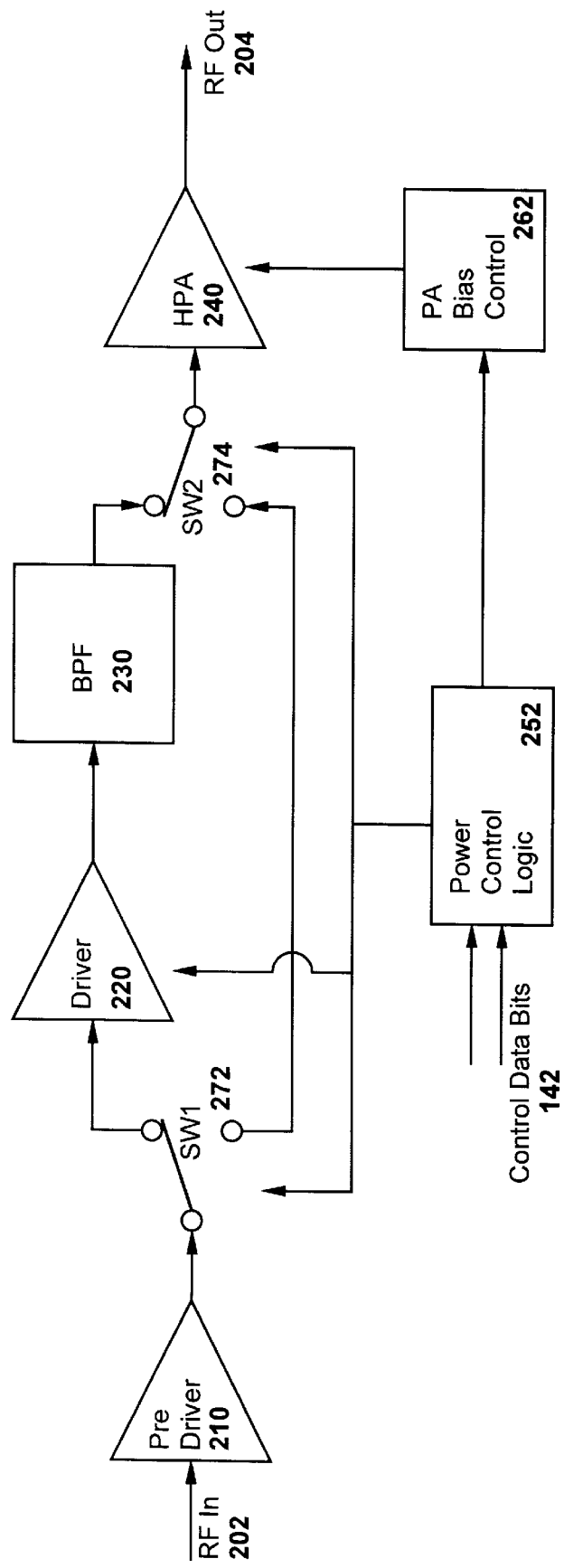

The RF amplifier 120 shown in FIG. 2A is constructed using three individual amplifiers. The pre-driver amp 210 is a low level amplifier that receives the output from the baseband processor 110. The output of the pre-driver amp 210 feeds a driver amp 220. The output of the driver amp 220 is bandpass filtered 230 before proceeding to the final high power amp 240. The pre-driver amp 210 and the driver amp 220 operate as class A amplifiers to maximize linearity. The high power amp 240 operates as a class AB amplifier in order to maximize the efficiency of the high power stage.

Gain switching and power control within the amplifier chain is accomplished through a combination of amplifier shutdown and amplifier biasing. Two data control bits 142 are provided to a power control logic 250 section of the amplifier chain. The output of the power control logic 250 section operates to switch the bias current to the driver amp 220 on or off depending on the state of the two control data bits 142. Additionally, the power control logic 250 sends information to a PA bias control 260 circuit that adjusts the bias current to the high power amplifier 240.

Adjusting the bias current on the high power amplifier 240 changes some of the critical operating parameters of the amplifier. The gain of the high power amplifier 240 varies with the bias current. The gain of the amp decreases with a decrease in bias current, although not proportionally. Also, the distortion parameters of the high power amplifier 240 change with bias current. The intercept points characterizing the higher order distortion products decrease as the bias current to the amplifier is decreased. The decreased higher order intercept points reduce the usable input power range. Because of the decreased high order intercepts greater distortion products are generated at lower input power levels. Therefore, the amplifier parameters must be carefully measured at varying bias levels before choosing the bias levels to use in the amplifier design.

The driver amp 220 is shut down when only a low output level is required from the amplifier chain. Shutting down the driver amp 220 conserves power that would otherwise be dissipated by the amp. When a low output power is required the bias current to the high power amplifier 240 is also reduced to a medium level. If the driver amp 220 were not shut down the attenuator within the baseband processor 110 would have to be increased in order to decrease the total output power. When the driver amp 220 is shut down it acts as a fixed attenuator. Similarly, when the bias current to the high power amplifier 240 is reduced the gain of the device is reduced. Since the shut down driver amp 220 acts as a fixed attenuator, the bias current to the high power amplifier 240 cannot be reduced to a minimal value since it must have enough gain to provide sufficient output power.

Therefore, in the amplifier configuration of FIG. 2A, the high power amplifier 240 has only two bias current options, high and medium. When a high output power is required from the amplifier chain the driver amp 220 is turned on and the high power amp 240 operates at high bias current.

When a moderate amount of output power is required of the amplifier chain the driver amp 220 remains on but the bias current on the high power amp 240 is reduced to the medium level. Although the gain and high order intercepts on the high power amp 240 are reduced with the reduction in bias current the distortion on the output signal is not increased since both the input power to the high power amp 240 and the required output power are reduced.

When low output power is required of the amplifier chain the driver amp 220 is shut off. In this condition the driver amp 220 acts as a fixed attenuator. The high power amp 240 operates with a medium bias current. The bias current to the high power amp 240 cannot be reduced to a low level because a low bias current decreases the gain of the amplifier below the level that is required to support the amplifier chain when the driver amp 220 is shut down.

Therefore, power savings are achieved by reducing the bias current in the high power amp 240 when high output power is not required. Additional power savings are achieved by shutting down the driver amp 220 when only a low output power is required from the amplifier chain.

In one particular implementation the high power state is used for output power levels above +16 dBm. A high bias current of 150 mA is used for the high power amp 240. The amplifier chain consumes a maximum of 440 mA when operated in the high power state. The maximum amplifier current consumption represents the total of all active devices in the amplifier chain. The maximum current value also takes into account the increased current consumption by the high power amplifier 240 when outputting higher power. The moderate output power state is defined as output power levels between −4 dBm and +16 dBm. The bias current to the high power amplifier 240 is reduced to 80 mA. The driver amp 220 is still active in the moderate power state. The amplifier chain consumes a maximum of 180 mA when operated in the moderate power state. The low output power state is defined as output power levels below −4 dBm. In the low power state the bias current to the high power amp 240 remains at 80 mA but the driver amp is shut down. The amplifier chain consumes a maximum of 82 mA when operated in the low power state.

The amplifier configuration of FIG. 2B provides improved power consumption. The amplifier chain utilizes a pre-driver 210, driver amp 220, and high power amp 240 as in the implementation shown in FIG. 2A. The improved amplifier implementation of FIG. 2B also incorporates two RF switches 272 and 274, that are used to route the signal path around the driver amp 220 and bandpass filter 230. The switches 272 and 274 can be set such that the signal from the pre-driver 210 is routed through the driver amp 220 and bandpass filter 230 before proceeding to the high power amplifier 240. This is accomplished by connecting the input of a first switch 272 to the output of the pre-driver amp 210. The switch is then positioned such that the signal flows to a first switch output connected to the input of the driver amp 220. To complete the signal path the input of a second switch 274 is connected to the output of the bandpass filter and the output of the second switch 274 is connected to the input of the high power amplifier 240.

In the alternative switch setting the signal is routed directly from the output of the pre-driver 210 to the input of the high power amp 240. In this configuration the driver amp 220 and the bandpass filter 230 are bypassed. To accomplish this configuration the input to the first switch 272 and the output to the second switch 274 are connected in the same manner as described above. However, the switches are positioned such that the signal is routed through a second output of the first switch 272 that is directly connected to a second input of the second switch 274.

The amplifier configuration of FIG. 2B uses the control data bits 142 in the same manner as the amplifier configuration of FIG. 2A. Power control logic 252 receives the control data bits 142 and directs the switch 272 and 274 positions accordingly. Power control logic 252 also directs the driver amp 220 to turn on or off according to the control data bit 142 values. Information from the power control logic 252 is used by the PA bias control 262 to adjust the bias current supplied to the high power amplifier 240.

Three output power levels are defined for the amplifier configuration of FIG. 2B. As will be discussed below, these three output power levels may not be the same as the output power levels defined for the amplifier configuration of FIG. 2A. In the amplifier configuration of FIG. 2B first, second, and third output power ranges are defined. The first output power range represents the lowest power range to be output from the amplifier. A second output power range greater than the first output power range defines a moderate output power from the amplifier. Finally, a third output power range greater than the second output power range defines a high output power from the amplifier.

Each of the three output power ranges has a corresponding bias current defined for the high power amplifier. There are first, second, and third bias current levels. The first bias current is a low level of bias current used with the high power amplifier. The second bias current is a moderate or intermediate level of bias current greater than the first bias current. The third bias current is a high level of bias current greater than the second bias current.

When a third output power is required from the amplifier chain the switches 272 and 274 are set such that the signal is routed through the driver amp 220 and bandpass filter 230. The driver amp 220 must be biased on and the high power amp 240 is supplied a third bias current. This state is effectively identical to the high power state for the amplifier configuration shown in FIG. 2A.

When a second power level is required from the amplifier chain the switches 272 and 274 are set such that the driver amp 220 and the bandpass filter 230 are bypassed. In this moderate second power state the driver amp 220 is shut off and a second bias current is supplied the high power amp 240.

The bandpass filter 230 is used to reject signals that appear in the phone receive band. The receive band signals present in the transmit path are the result of signal bleed through from the receive path. The bandpass filter 230 is used to provide increased isolation from the receive path to the transmit output. The spurious receive path signals are above the transmit path noise floor only for high levels of gain in the transmit path. Therefore, in the preferred embodiment the bandpass filter 230 is bypassed along with the driver amp 220. Bypassing the bandpass filter 230 allows the insertion loss associated with the filtering to be eliminated when the component is bypassed. Alternatively, the second switch 274 may be placed prior to the bandpass filter 230 so that it is not bypassed.

When a first output power is required from the amplifier chain the switches 272 and 274 are set to bypass the driver amp 220 and bandpass filter 230. The high power amp 240 is supplied with a first bias current.

In one particular implementation of the amplifier configuration shown in FIG. 2B the third power state is defined as output power above +16dBm. In the third power state the driver amp 220 is active and included in the signal path. The high power amp 240 is biased with 150 mA of current. The amplifier chain consumes a maximum of 440 mA when operated in the high power state. The second power state is a moderate power state and is defined as output power levels from +8 dBm to +16 dBm. In the second power state the driver amp 220 is bypassed and the bias current for the high power amplifier 240 is reduced to 80 mA. The amplifier chain consumes a maximum of 140 mA when operated in the second power state. The first power state is defined as output power levels below +8 dBm. In the first power state the driver amp 220 is bypassed and the bias current for the high power amplifier 240 is further reduced to 40 mA. The amplifier chain consumes a maximum of 64 mA when operated in the low power state.

The two RF switches 272 and 274 are implemented as active switches such as PIN diode switches or FET switches. Mechanical switches could be used but there are reliability and switching time issues related to mechanical switches that make them undesirable for this application.

It is a paradoxical result that the inclusion of two active switches 272 and 274 that consume power provides power savings in the RF amplifier 120. The source of the power savings is largely due to the ability to operate the improved RF amplifier of FIG. 2B in a power conserving state over greater conditions. The source of the power savings can be better explained by comparing the two RF amplifier designs.

The high power state for the amplifier configurations of FIG. 2A and FIG. 2B are functionally identical. Both amplifiers define the high power state as output power levels above +16 dBm. The RF transmit signal is routed through all components in the amplifier chain and the bias levels for the amplifiers are identical.

The moderate power states of the two RF amplifier configurations differ in RF output power range covered and in amplifier power consumption. The design of FIG. 2A defines the moderate power state over the RF output range of −4 dBm to +16 dBm. The amplifier design of FIG. 2B defines the moderate (second) power state over the RF output range of +8 dBm to +16 dBm. While both amplifier designs reduce the bias current on the high power amplifier 240 the design of FIG. 2B additionally bypasses the driver amp 220 and shuts it off. This results in a 40 mA current difference between the two amplifiers operating in the moderate power state.

The major difference between the two amplifier designs is in the low power state. This is defined as output power in the first output power range. The amplifier configuration of FIG. 2A defines the low power state for RF output power below −4 dBm whereas the amplifier design of FIG. 2B defines the low power state for RF output power below +8 dBm. The amplifier design of FIG. 2A shuts down the driver amp 220 but does not further reduce the bias current to the high power amp 240. The design of FIG. 2A can only utilize two bias current levels for the high power amplifier 240 due to the signal attenuation contributed by the driver amp 220 when it is turned off. Therefore, not only is the driver amp 220 not providing any signal gain, it is acting as an attenuator. The bias current for the high power amp 240 cannot be reduced below the medium bias because the gain of the high power amp 240 would drop to a level where it could not compensate for the change in signal gain due to shutting down the driver amp 220. In contrast, the amplifier design of FIG. 2B further reduces the bias current to the high power amp 240 in the low power state. This results in an 18 mA difference in current consumption between the two amplifier designs. Since the driver amp 220 is bypassed when it is shut off there is no additional signal loss incurred. Therefore, the amplifier chain can readily accommodate a gain reduction in the high power amp 240. Because there is no signal loss associated with switching off the driver amp 220 the low power state can operate at a much higher output power level. The increased operating range of the low power state further conserves power by minimizing the time that the RF amplifier 120 must operate in one of the higher power states.

Two phones were constructed to test the decreased power consumption using the new RF amplifier design. The two phones were identical escept for the RF amplifier. The performance of the two amplifier designs was compared using a call model specified by the CDMA Development Group. The result was a reduction in total phone current consumption with the new design of approximately 7% for both urban and suburban call models. This translates into an increased talk time of approximately 8%. Since the only difference in the two phones was the RF amplifier, the percentage improvement, when comparing only the current consumption of the RF amplifiers, is much more significant. However, the user only realizes the percentage improvement in total power consumption. Therefore, only the improvement in total current consumption and the corresponding improvement in talk times are provided.

Increased talk time is not the only advantage of the amplifier configuration of FIG. 2B. There are now three bias current levels available for the high power amplifier 240.

Each bias current is tailored to achieve the required amplifier linearity over the operating range of the bias current level. The use of three bias current levels in conjunction with bypassing the driver amp 220 stage relaxes the linearity requirement on the high power amplifier 240. This allows a more common low cost amplifier to be used for the high power amp 240.

Therefore, the addition of RF switches 272 and 274 that bypass a driver amp 220 into an RF amplifier chain extends the talk time of the phone while simultaneously reducing the phone cost.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An RF amplifier for a wireless phone comprising:
   a pre-driver amplifier;
   a driver amplifier;
   a bandpass filter with an input connected to an output of the driver amplifier;
   a high power amplifier;
   a first RF switch having an input connected to an output of the pre-driver amplifier with a first switch output connected to an input of the driver amplifier;
   a second RF switch having an output connected to an input of the high power amplifier, a first input connected to the output of the bandpass filter, and a second input connected to a second output of the first RF switch such that the driver amplifier and bandpass filter can be switchably bypassed; and
   a power control logic circuit that inputs data control bits and provides corresponding output signals that control the first and second RF switch positions and controls a bias current of the high power amplifier to one of a plurality of active bias levels.

2. The RF amplifier of claim 1 wherein the power control logic also outputs a signal that controls the driver amplifier to an ON or OFF state.

3. The RF amplifier of claim 2 wherein the power control logic controls the driver amplifier to an ON state when the RF switches are positioned to connect the pre-driver amplifier to the driver amplifier and the bandpass filter to the high power amplifier.

4. The RF amplifier of claim 3 wherein the power control logic outputs information controlling the bias current to the high power amplifier to a predetermined high level when the RF switches are positioned to connect the pre-driver amplifier to the driver amplifier and the bandpass filter to the high power amplifier.

5. The RF amplifier of claim 2 wherein the power control logic controls the driver amplifier to an OFF state when the RF switches are positioned to bypass the driver amplifier and bandpass filter.

6. A method for RF amplification in a wireless phone comprising:
   providing a three stage amplifier comprising a pre-driver amplifier, a driver amplifier, and a high power amplifier;
   inputting to power control logic on the amplifier one of a plurality of possible power control states;
   configuring a signal path through the three stage amplifier according to the input power control state;
   configuring a bias current supplied to the high power amplifier to one of a plurality of active bias levels according to the input power control state.

7. The method of claim 6 further comprising the steps:
   configuring the driver amplifier to an ON or OFF state according to the input power control state.

8. The method of claim 7 wherein the bias current supplied to the high power amplifier is a first bias current when the power control state is a first power state.

9. The method of claim 7 wherein the bias current supplied to the high power amplifier is a second bias current greater than a first bias current when the power control state is a second power state, wherein the second power control state is defined as a range of amplifier output power greater than the amplifier output power in a first power control state.

10. The method of claim 7 wherein the bias current supplied to the high power amplifier is a third bias current greater than either a first or second bias current when the power control state is a third power state, wherein the third power control state is defined as a range of amplifier output power greater than the amplifier output power in a first or a second power control state.

11. The method of claim 6 wherein the signal path is configured to flow from the pre-driver amplifier to the high power amplifier and bypasses the driver amplifier when the power control state is a first power state or a second power state, wherein the second power state is defined as a range of amplifier output power greater than the amplifier output power in the first power state.

12. The method of claim 11 wherein the driver amp is configured to an OFF state when the input power control state is the first power state or the second power state.

13. The method of claim 6 wherein the signal path is configured to flow from the pre-driver amplifier to the driver amplifier and then to the high power amplifier when the input power control state is a third power state, wherein the third power state is defined as a range of amplifier output power greater than the amplifier output power in a first power state or a second power state.

* * * * *